United States Patent [19]

Tomita

[11] Patent Number: 5,677,643
[45] Date of Patent: Oct. 14, 1997

[54] POTENTIAL DETECTING CIRCUIT WHICH SUPPRESSES THE ADVERSE EFFECTS AND ELIMINATES DEPENDENCY OF DETECTED POTENTIAL ON POWER SUPPLY POTENTIAL

[75] Inventor: Naoto Tomita, Yokohama, Japan

[73] Assignee: Kabushiki Kaisha Toshiba, Kawasaki, Japan

[21] Appl. No.: 798,996

[22] Filed: Feb. 7, 1997

Related U.S. Application Data

[63] Continuation of Ser. No. 390,514, Feb. 17, 1995, abandoned.

[30] Foreign Application Priority Data

Feb. 17, 1994 [JP] Japan ................... 6-020445

[51] Int. Cl.⁶ .................................. H03K 5/153
[52] U.S. Cl. .................. 327/78; 327/89; 327/143; 327/437
[58] Field of Search .................. 327/77, 78, 80, 327/81, 89, 143, 436, 437, 534, 535, 536, 537, 538, 540, 541, 543

[56] References Cited

U.S. PATENT DOCUMENTS

| | | | |
|---|---|---|---|
| 4,471,209 | 9/1984 | Yamaguchi | 323/274 |
| 4,709,165 | 11/1987 | Higuchi et al. | |
| 4,716,307 | 12/1987 | Aoyama | 327/541 |
| 4,769,784 | 9/1988 | Doluca et al. | 365/149 |
| 4,788,510 | 11/1988 | Wozniak | 327/68 |
| 4,792,749 | 12/1988 | Kitagawa et al. | 323/314 |
| 4,849,661 | 7/1989 | Bazes | 327/541 |
| 5,063,304 | 11/1991 | Iyengar | 327/310 |
| 5,077,521 | 12/1991 | Langford, II et al. | 324/158 |
| 5,113,089 | 5/1992 | Osawa | 327/77 |
| 5,263,201 | 11/1993 | Atsumi et al. | 365/185 |
| 5,266,840 | 11/1993 | Leipold et al. | 307/125 |
| 5,321,653 | 6/1994 | Suh et al. | 327/541 |
| 5,329,171 | 7/1994 | Shimizu et al. | 327/78 |
| 5,357,149 | 10/1994 | Kimura | 327/512 |
| 5,396,114 | 3/1995 | Lee et al. | 327/535 |
| 5,426,616 | 6/1995 | Kajigaya et al. | 365/226 |

FOREIGN PATENT DOCUMENTS

| | | | |
|---|---|---|---|
| 1-112815 | 5/1989 | Japan | 327/541 |
| 2-84761 | 3/1990 | Japan | 327/543 |

*Primary Examiner*—Terry Cunningham
*Attorney, Agent, or Firm*—Banner & Witcoff, Ltd.

[57] ABSTRACT

A potential detecting circuit comprises a MOSFET, a constant current circuit, a reference potential generating circuit and a comparing circuit. A power supply potential is applied to a drain of the MOSFET and a subject potential to be detected is applied to the gate of the MOSFET. The constant current circuit is connected to a source of the MOSFET. The comparing circuit compares a reference potential output from the reference potential generating circuit with a source potential of the MOSFET. A detection output is obtained on the basis of the comparison result. The source potential of the MOSFET is increased in accordance with an increase of the subject potential. When the source potential coincides with the reference potential output from the reference potential generating circuit, the level of the source potential is detected as a detection level.

21 Claims, 6 Drawing Sheets

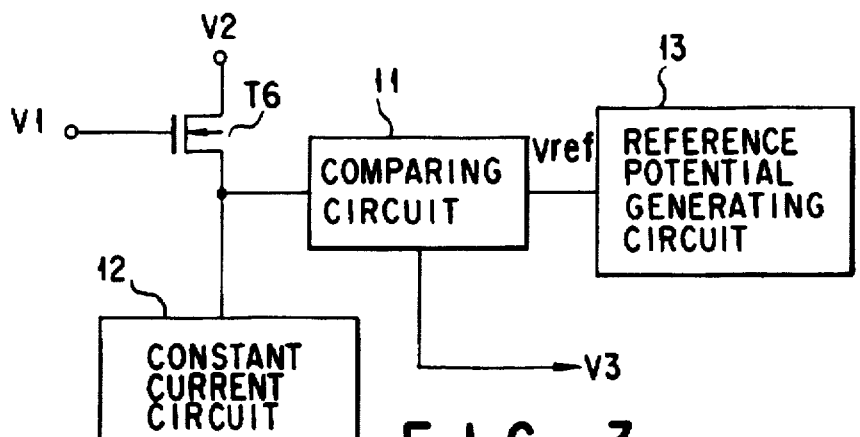
F I G. 3

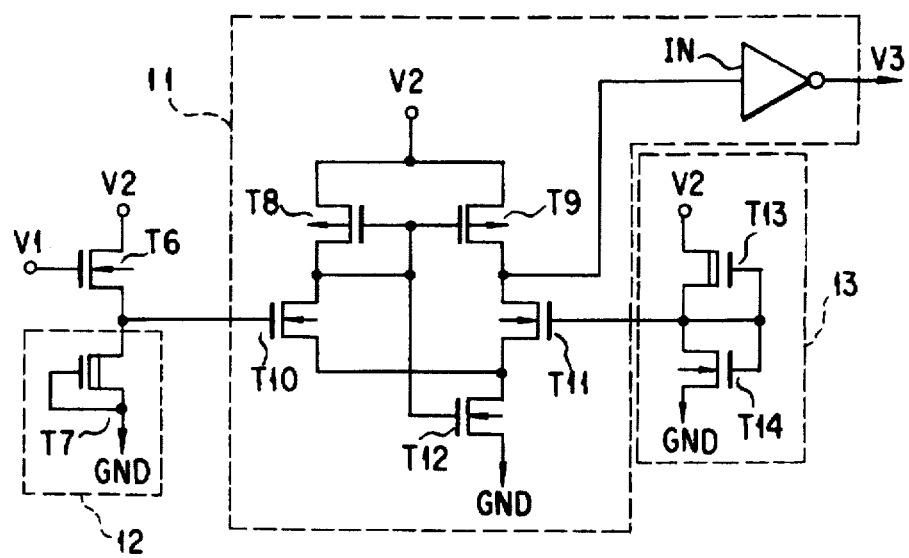
F I G. 4
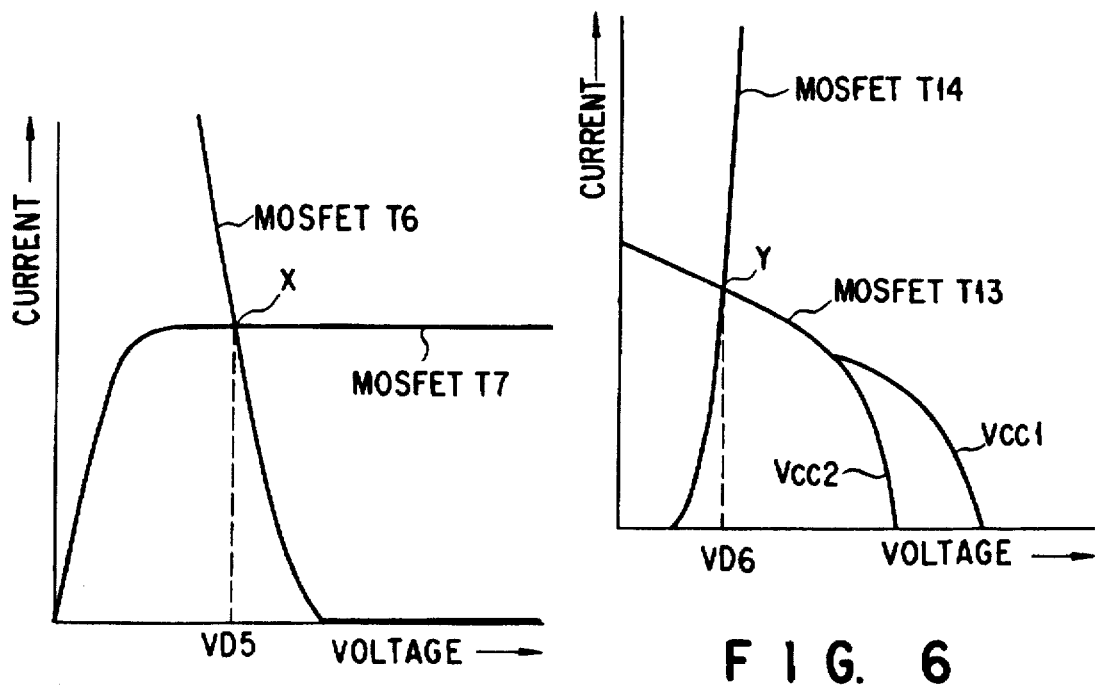
F I G. 5
F I G. 6

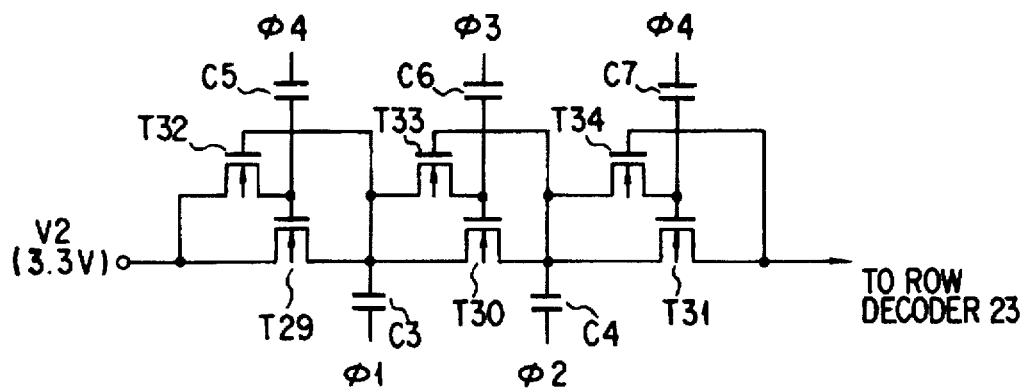
F I G. 15
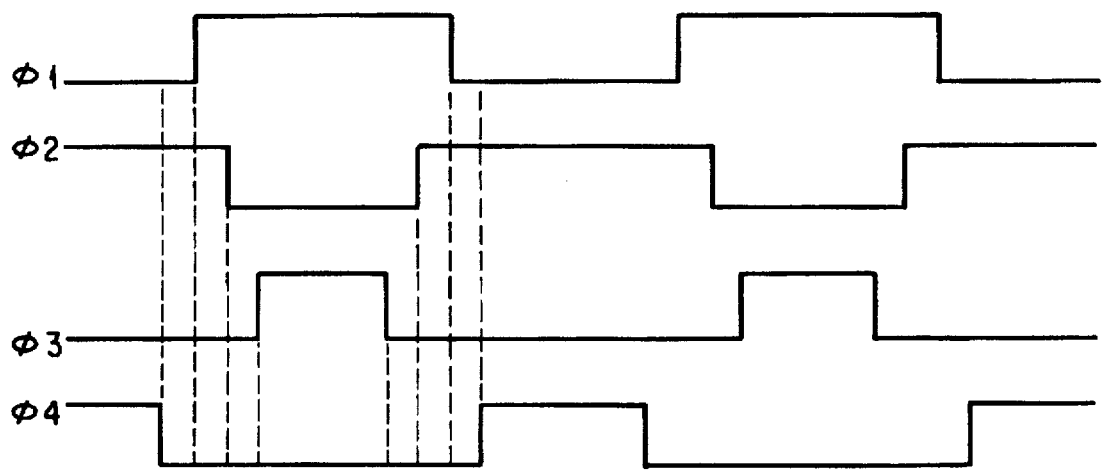
F I G. 16
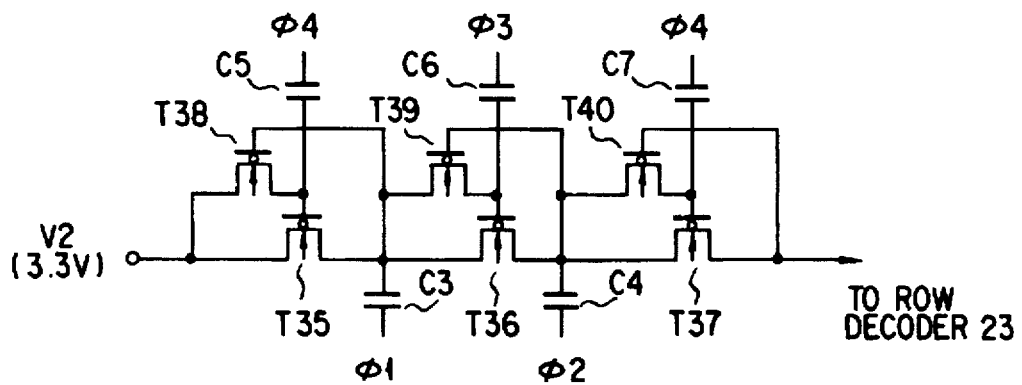
F I G. 17

5,677,643

POTENTIAL DETECTING CIRCUIT WHICH SUPPRESSES THE ADVERSE EFFECTS AND ELIMINATES DEPENDENCY OF DETECTED POTENTIAL ON POWER SUPPLY POTENTIAL

This application is a continuation, of application Ser. No. 08/390,514, filed Feb. 17, 1995, now abandoned.

BACKGROUND OF THE INVENTION

1. Field of the Invention

The present invention relates generally to a potential detecting circuit in a semiconductor IC device, and more particularly to a potential detecting circuit for detecting a potential higher than a supply potential, without discharging a current.

2. Description of the Related Art

In recent years, the demand for a semiconductor IC device, which is driven by a lower supply voltage, has been increasing. For example, a flash memory has been driven by a power supply of 3 V. When a relatively low power supply is used in a flash memory, if a word line is driven by a power supply potential in a reading operation, a distribution width of the threshold voltage of a cell ("1" cell), wherein electrons are extracted through the floating gate, must be shrunk to the same extent as the supply voltage. This is because the threshold voltage of the "1" cell must be lower than the potential of the word line. However, on the present level of the art, it is difficult to shrink the distribution of the threshold voltage of a "1" cell to the same extent as the power supply.

To overcome this problem, it is proposed that the potential of a word line be boosted to a value higher than the supply potential, so that the distribution width of the threshold voltage need not be shrunk. However, since it takes a considerable period of time, longer than a reading time, to stabilize the potential of the word line from the start of the boost, it is necessary that the boost of the potential be started in a stand-by state in order to achieve a CE access. Under the circumstances, a technique for saving power has been proposed, in which a current consumption is allowed at the beginning of a stand-by state; when the potential is increased by a boosting operation to a target value, the boost is ceased; and the potential is boosted again, when it lowers. For this purpose, a potential detecting circuit is required to detect whether the potential reaches a target value and whether the potential lowers.

FIG. 1 shows a conventional potential detecting circuit for detecting a potential higher than a supply potential. For example, U.S. Pat. No. 4,709,165 for "VOLTAGE SUPPLY LEVEL DETECTING CIRCUIT" is known as the prior art related to this type of potential detecting circuit. The circuit shown in FIG. 1 comprises P-channel type MOSFETs T1, T2 and T4 and N-channel MOSFET T3 and T5. A subject potential V1 to be detected is applied to a source of the MOSFET T1. A gate and a drain of the MOSFET T1 are connected to a source of the MOSFET T2. A drain of the MOSFET T2 is connected to a drain of the MOSFET T3. A source of the MOSFET 3 is connected to a ground GND. Gates of the MOSFETs T2 and T3 are connected to a power supply V2. Drains of the MOSFETs T2 and T3 (node N1) are connected to an input terminal of an inverter comprised of the MOSFETs T4 and T5. A detection output V3 is obtained through an output terminal (node N2) of the inverter.

In the circuit shown in FIG. 1, if the subject potential V1 is the same as or lower than the supply potential V2, the potential at the node N1 is of low (L) level and the potential at node N2 is of high (H) level. When the subject potential V1 is increased, the potential of the node N1 is also increased. When the potential of the node N1 reaches the threshold voltage Vth of the inverter (T4, T5), the potential at the node N2 is inverted to the L level. In FIG. 2, Vth(T2) denotes a threshold voltage of the MOSFET T2.

However, in the potential detecting circuit of the above structure, since a current flows from the potential to be monitored (the subject potential V1) to the ground GND through current paths of the MOSFETS T1, T2 and T3, the potential V1 is lowered in a short period of time. For this reason, the potential must be boosted frequently, and therefore power in the stand-by state cannot be saved. Further, the conventional potential detecting circuit is disadvantageous in that a detection level VL is changed in accordance with a change in the threshold voltage of the inverter comprised of the MOSFETs T4 and T5 due to a change of the supply potential V2.

SUMMARY OF THE INVENTION

It is accordingly an object of the present invention to provide a potential detecting circuit which can detect a potential without changing the level of the potential.

Another object of the present invention is to provide a potential detecting circuit which can reduce dependency of a detection level on a supply potential.

The above objects can be achieved by a potential detecting circuit comprising: a MOSFET having a drain to which a power supply potential is applied and a gate to which a subject potential to be detected is applied; a load circuit connected to a source of the MOSFET; a reference potential generating circuit for generating a reference potential; and a comparing circuit for comparing a supply potential of the MOSFET with the reference potential generated by the reference potential generating circuit, wherein a level of the subject potential is detected on the basis of a comparison output from the comparing circuit.

With the above structure, since the subject potential is applied to the gate of the MOSFET, the potential can be detected without an influence on the subject potential. Further, if a difference between the subject potential and the threshold voltage of the MOSFET is set lower than the supply potential, the MOSFET performs a pentode operation, with the result that the dependency of the detection level on the power supply potential can be reduced. If the reference potential generating circuit is constituted by a circuit independent of the power supply potential, the dependency on the power supply potential can be further reduced.

In the manner as described above, a potential detecting circuit, which does not influence the subject potential and has less dependency of the detection level on the power supply potential, can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a block diagram schematically showing a structure of a potential detecting circuit according to an embodiment of the present invention;

FIG. 4 is a circuit diagram showing details of the potential detecting circuit shown in FIG. 3;

FIG. 5 is a voltage-current characteristic diagram showing load characteristics of a MOSFET for detecting a potential and a MOSFET forming a constant current circuit of the potential detecting circuit shown in FIG. 4;

FIG. 6 is a voltage-current characteristic diagram showing load characteristics of MOSFETs forming a reference voltage generating circuit of the potential detecting circuit shown in FIG. 4;

FIG. 15 is a circuit diagram showing another structure of a boosting section of the charge pump circuit shown in FIG. 13;

FIG. 16 is a timing chart showing clock signals generated in the circuit shown in FIG. 15;

FIG. 17 is a circuit diagram showing still another structure of the charge pump circuit shown in FIG. 12;

DETAILED DESCRIPTION OF THE PREFERRED EMBODIMENTS

Figure 1:
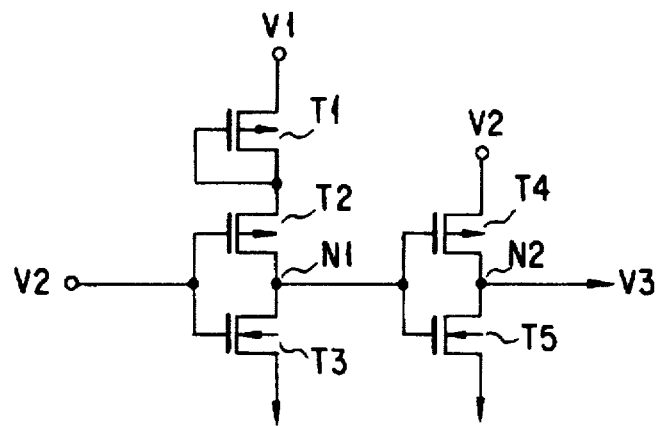
FIG. 1 is a circuit diagram showing a conventional potential detecting circuit.
Figure 2:
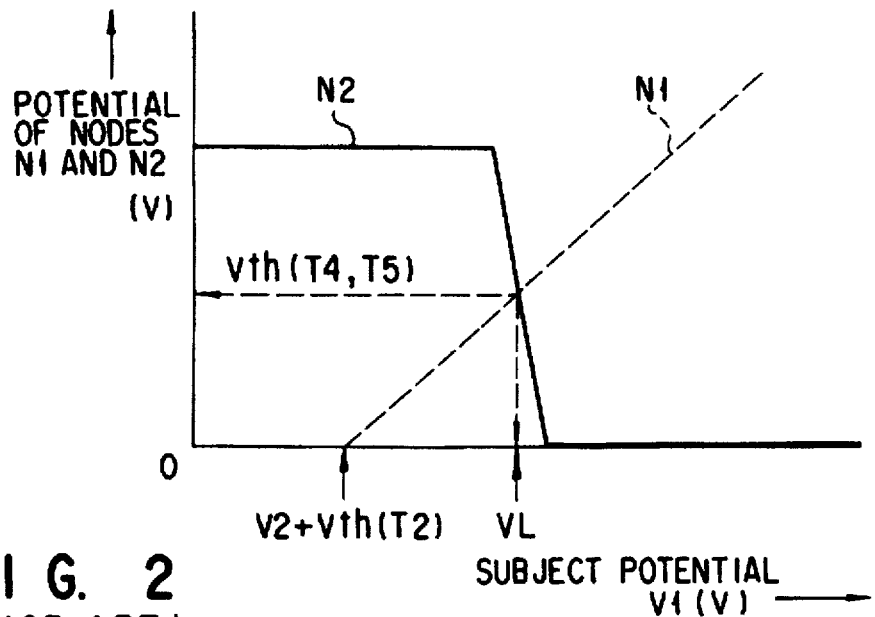
FIG. 2 is a waveform diagram showing the relationship between a subject potential and a potential at each node, for explaining an operation of the circuit shown in FIG. 1.

FIG. 3 is a block diagram showing an outline of a potential detecting circuit according to an embodiment of the present invention. A supply potential V2 is applied to a drain of an N-channel enhancement type MOSFET T6. A subject potential V1 is applied to a gate thereof (V1>V2). A source of the MOSFET T6 is connected to a constant current circuit 12. A source potential of the MOSFET T6 is compared by a comparing circuit 11 with a reference potential $V_{ref}$ output from a reference potential generating circuit 13, thereby obtaining a detection output V3.

In the above structure, the source potential of the MOSFET T6 is increased in accordance with an increase of the subject potential V1. When the source potential becomes equal to "$V_{ref}$+Vth(T6)" (Vth(T6): a threshold voltage of the MOSFET T6), the level of the source potential is detected as a detection level VL.

FIG. 4 shows details of the potential detecting circuit shown in FIG. 3. The constant current circuit 12 comprises an N-channel depletion type MOSFET T7. The comparing circuit 11 comprises a differential amplifier, formed of P-channel enhancement type MOSFETs T8 and T9 and N-channel enhancement type MOSFETs T10 to T12, and an inverter IN for shaping a waveform. The reference potential generating circuit 13 comprises an N-channel depletion type MOSFET T13 and an N-channel enhancement type MOSFET T14.

The subject potential V1 is applied to the gate of the MOSFET T6, and the drain and the source thereof are respectively connected to the power supply V2 and a drain of the MOSFET T7. A gate and a source of the MOSFET T7 are connected to a ground GND. Sources of the MOSFETs T8 and T9 are connected to the power supply V2 and gates thereof are connected to each other. Drains of the MOSFETs T8 and T9 are respectively connected to drains of the MOSFETs T10 and T11. The drain of the MOSFET T10 is connected to the gates of the MOSFETs T8, T9 and T12. The gate of the MOSFET T10 is connected to the source of the MOSFET T6. Sources of the MOSFETs T10 and T11 are connected to each other at a connection node therebetween. A current path of the MOSFET T12 is connected between this connection node and the ground GND.

Current paths of the MOSFETs T13 and T14 are connected in series between the power supply V2 and the ground GND. A gate of the MOSFET T11 is connected to gates of the MOSFETs T13 and T14 and also to a connection node between the current paths of the MOSFETs T13 and T14. An input terminal of the inverter IN is connected to the drains of the MOSFETs T9 and T11. A detection output V3 is obtained through an output terminal of the inverter IN.

FIG. 5 shows load characteristics of the MOSFETs T6 and T7 shown in FIG. 4. In FIG. 5, an abscissa represents a source potential of the MOSFET T6 and a drain potential of the MOSFET T7 and an ordinate represents currents flowing through the current paths of the MOSFETs T6 and T7. Since the subject potential V1 is only applied to the gate of the MOSFET T6, a current path for this potential is not formed. A potential VD5 at an intersection X of the two characteristic curves in FIG. 5 can be adjusted to a potential lower than the supply potential V2 by changing the ratio of the driving capacity of the MOSFET T6 to that of the MOSFET T7. If the relationship among the threshold voltage Vth (including the back gate bias effect), the subject potential V1 and the supply potential V2 satisfies the condition defined by the formula (1): V1−Vth≦V2, the MOSFET T6 operates as a pentode. In this case, the dependency of the MOSFET T6 on the supply potential V2 can be eliminated (or reduced).

FIG. 6 shows load characteristics of the MOSFETs T13 and T14 in the circuit shown in FIG. 4. In FIG. 6, an abscissa represents a source potential of the MOSFET T13 and a drain potential of the MOSFET T14 and an ordinate represents currents flowing through the current paths of the MOSFETs T13 and T14. The voltage-current characteristic curves $V_{cc1}$ and $V_{cc2}$ of the MOSFET T13 represent a difference in characteristic in accordance with the change of the supply potential V2. A potential VD6 at an intersection Y of the two characteristic curves in FIG. 6 corresponds to the reference potential $V_{ref}$. As evident from FIG. 6, the characteristic curves coincide with each other in the pentode operation region, whether the supply potential V2 is $V_{cc1}$ or $V_{cc2}$. Therefore, if the potential VD6 is set in a region where the MOSFET T13 operates as a pentode at the lowermost value of the variation of the supply potential V2, the reference potential $V_{ref}$ is independent of the supply potential V2.

In the case of a non-volatile memory, the MOSFET T6 can be replaced by a cell transistor, making use of the characteristic of the cell transistor that the threshold voltage can be increased. In this case, since the detection level may be changed if the threshold voltage is changed, it is necessary to be careful not to erroneously write or erase data in or from the cell transistor.

Figure 7:
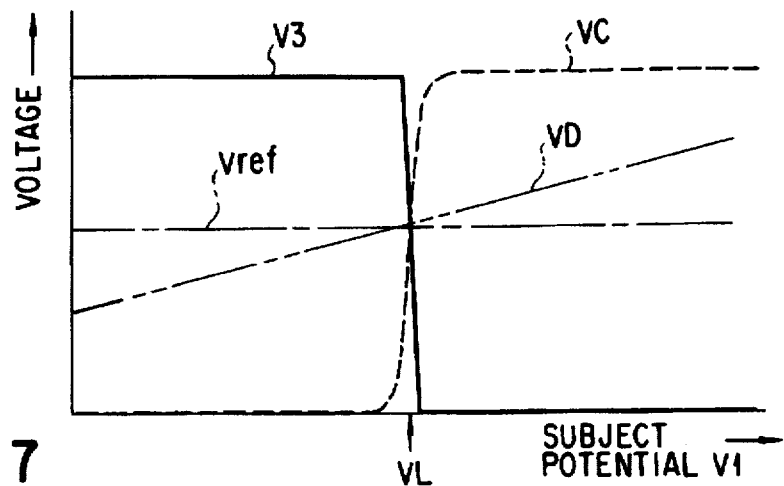
FIG. 7 is a waveform diagram showing waveforms in accordance with a change in potential.

FIG. 7 shows waveforms obtained when the potential is varied. In FIG. 7, VC denotes an output potential of the differential amplifier (a potential at the input terminal of the inverter IN) and VD denotes a source potential of the MOSFET T6. The output potential VC of the differential amplifier and the detection output V3 are inverted at a point where the potential VD, obtained by lowering the subject potential V1, coincides with the reference potential $V_{ref}$.

With the above structure, since the subject potential V1 is input to the gate of the MOSFET T6, the level of the potential V1 can be detected without an influence on the potential V1. Further, if the relationship among the threshold voltage Vth of the N-channel type MOSFET T6, the subject potential V1 and the supply potential V2 satisfies the condition defined by the formula (1), since the MOSFET T6 operates as a pentode, detection independent of the supply potential V2 can be achieved. Further, since the reference potential generating circuit 13 is also independent of the supply potential V2, the change in the detection level due to the change in the supply potential V2 can be suppressed.

When the potential of a word line is boosted in a flash memory, the potential can be higher than the supply voltage. If the potential of the word line is too high, data may be erroneously written in an unselected cell. Therefore, the potential of the word line must be suppressed to a suitable level. Moreover, since a high potential is required for writing and erasing operations, a high potential transistor having a high threshold voltage is generally used in the flash memory. Hence, if such a high potential transistor is used as the MOSFET T6, the above formula (1) can be easily satisfied. Further, if the aforementioned problem of erroneous writing and erasing is overcome, a cell transistor can be utilized, so that the threshold voltage can be much higher and dependency on a power potential can be eliminated. From this view point, it is very useful to use the potential detecting circuit as shown in FIGS. 3 and 4 for the purpose of detecting a boosted potential of the word line in order to suppress the standby current in a flash memory.

For the other purposes, if a detected potential need not be so accurate, a high level potential can be detected without supplying a current from a node, through which the potential is supplied, although the detected potential level slightly depends on the supply potential.

The comparing circuit 11, the constant current circuit 12 and the reference potential generating circuit 13 are not limited to those as shown in FIG. 4, but can be any other circuits which satisfy the respective functions. For example, the constant current circuit 12 can be replaced by an N-channel enhancement type MOSFET T15, in which the gate and the drain are connected to each other, as shown in FIG. 8.

Figure 8:
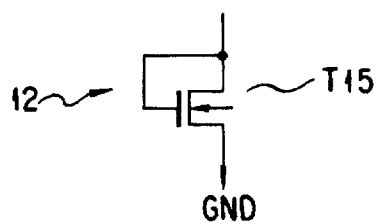
FIG. 8 is a diagram showing another structure of the constant current circuit of the potential detecting circuit shown in FIG. 4.
Figure 9:
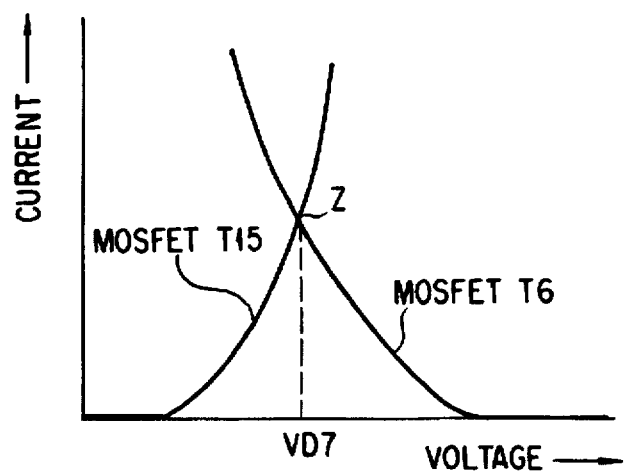
FIG. 9 is a voltage-current characteristic diagram showing load characteristics of the constant current circuit shown in FIG. 8.

FIG. 9 shows load characteristics of the MOSFETs T15 and T6 when the constant current circuit 12 shown in FIG. 8 is used. A potential VD7 at an intersection Z, i.e., a potential of the drain of the MOSFET T15, is input to the comparing circuit 11.

As evident from FIG. 9, the constant current circuit 12 as shown in FIG. 8 can also provide the same effect and advantage as those of the circuit shown in FIG. 4.

Figure 10:
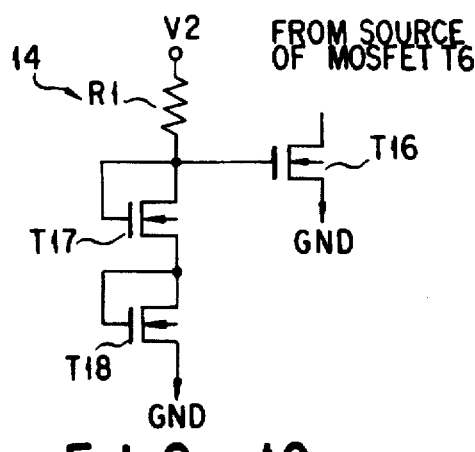
FIG. 10 is a diagram showing still another structure of the constant current circuit of the potential detecting circuit shown in FIG. 4.

FIG. 10 shows still another structure of the constant current circuit 12 of the circuit shown in FIG. 4. The circuit shown in FIG. 10 comprises an N-channel enhancement type MOSFET T16 and a biasing circuit 14 for applying a bias voltage to the gate of the MOSFET T16. The biasing circuit 14 includes a load resistor R1, connected in series between the power supply V2 and the ground GND, and N-channel enhancement type MOSFETs T17 and T18. The constant circuit shown in FIG. 10 can also provide the same effect and advantage as those of the circuits shown in FIGS. 4 and 8.

Although a DC current flows from the power supply V2 through the resistor R1 and a current path of the MOSFETs T17 and T18 to the ground GND, an increase of a current consumption can be very little, if the resistance of the resistor R1 is sufficiently high.

Figure 11:
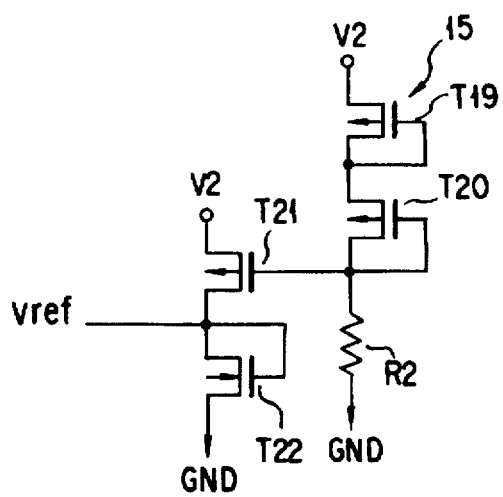
FIG. 11 is a diagram showing another example of the reference voltage generating circuit of the potential detecting circuit shown in FIG. 4.

FIG. 11 shows another example of the reference voltage generating circuit 13 of the circuit shown in FIG. 4. The circuit shown in FIG. 11 comprises a P-channel MOSFETs T19, T20 and T21, an N-channel type MOSFET T22 and a load resistor R2. The MOSFETs T19 and T20 and the resistor R2 constitute a biasing circuit 15. The gate of the MOSFET T21 is biased by the biasing circuit 15. A reference potential is output through a connection node between the MOSFETs T21 and T22. In the same manner as in the circuit shown in FIG. 10, although a DC current flows from the power supply V2 through a current path of the MOSFETs T19 and T20 and the resistor R2 to the ground GND, an increase of a current consumption can be very little, if the resistance of the resistor R2 is sufficiently high.

In the circuits shown in FIGS. 10 and 11, since a depletion type MOSFET is not used, they can be produced in simpler steps than that for producing the circuit shown in FIG. 4.

Figure 12:
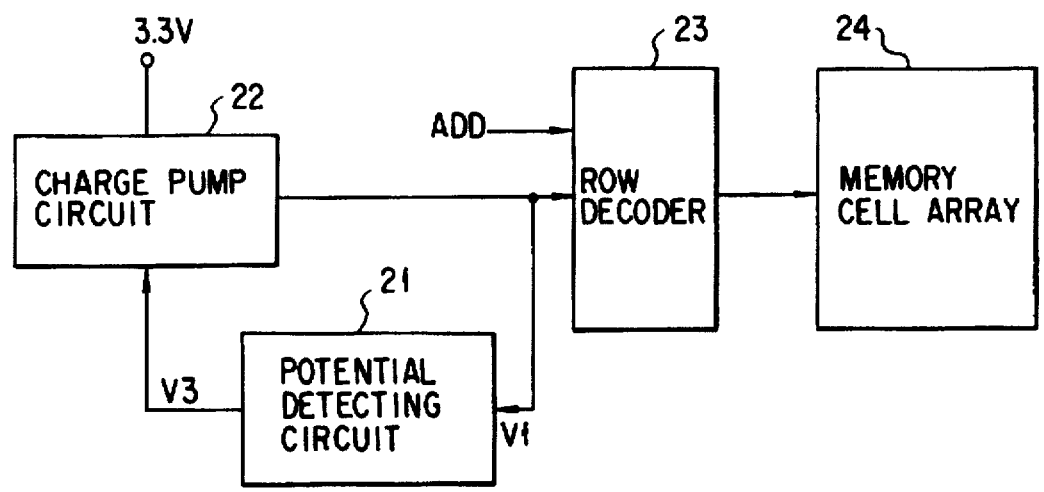
FIG. 12 is a block diagram showing a circuit section for applying a potential, higher than a supply potential, from a charge pump circuit to a row decoder, for explaining a case in which the potential detecting circuit of the present invention is applied to a semiconductor memory device.

FIG. 12 shows a circuit section for applying a potential, higher than a supply potential, from a charge pump circuit to a row decoder, for explaining a case in which the potential detecting circuit of the present invention is applied to a semiconductor memory device. A potential detecting circuit 21 shown in FIG. 12, having the same structure as that of the circuit shown in FIG. 3, detects a boosted potential (subject potential V1) supplied from a charge pump circuit 22 to a row decoder 23, and supplies a signal V3 to the charge pump circuit 22, thereby controlling a boosting operation. The charge pump circuit 22 is operated by a supply voltage of, for example, 3.3 V, boosts the supply voltage and supplies it to the row decoder 23. The row decoder 23 receives the boosted potential as a power supply, decodes a row address signal Add and supplies the boosted potential to a selected row of a memory cell array 24.

Figure 13:
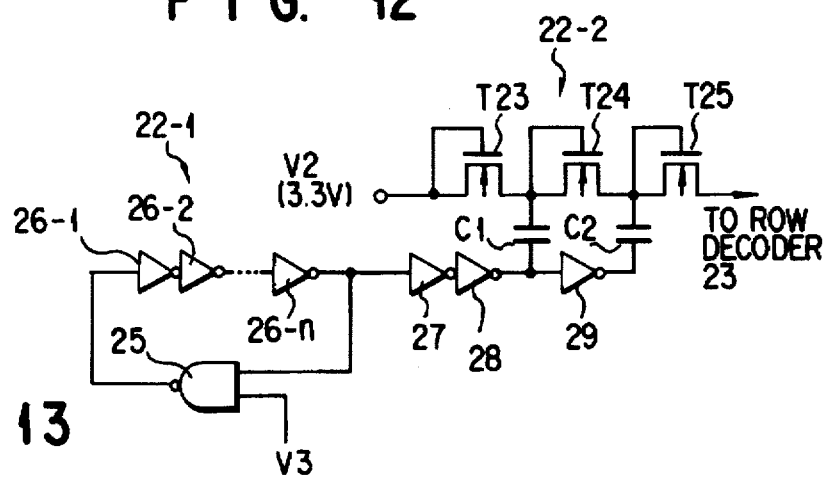
FIG. 13 is a circuit diagram showing a structure of the charge pump circuit shown in FIG. 12.

FIG. 13 shows a structure of the charge pump circuit 22 shown in FIG. 12. The charge pump circuit 22 comprises an oscillating section 22-1, formed of a ring oscillator, and a boosting section 22-2. An operation of the oscillating section 22-1 is controlled by the output signal V3 of the potential detecting circuit 21. More specifically, the signal V3 output from the potential detecting circuit 21 is supplied to one input terminal of a NAND gate 25, and an output of the NAND gate 25 is supplied to the other input terminal of the NAND gate 25 through inverters 26-1 to 26-n (where "n" is an even number). The boosting section 22-2 comprises N-channel enhancement type MOSFETs T23 to T25, capacitors C1 and C2 and inverters 27 to 29. Current paths of the MOSFETs T23 to T25 are connected in series. A power supply V2 (3.3 V) is applied to one end of the serially connected current paths and a row decoder 23 is connected to the other end thereof. The gate of the MOSFET T23 is connected to the drain thereof. The gate of the MOSFET T24 is connected to the drain thereof. The gate of the MOSFET T25 is connected to the drain thereof. An oscillation output of the oscillating section 22-1, i.e., an output signal from the inverter 26-n, is supplied to one electrode of the capacitor C1 through the inverter 27 and 28. The other electrode of the capacitor C1 is connected to a connection node between current paths of the MOSFETs T23 and T24. An output signal from the inverter 28 is supplied to one electrode of the capacitor C2 through the inverter 29. The other electrode of the capacitor C2 is connected to a connection node between current paths of the MOSFETs T24 and T25.

In the above structure, while the signal V3 output from the potential detecting circuit 21 is being set in the "H" level, the NAND gate 25 executes an inverter operation, so that the oscillating section 22-1 performs an oscillating operation. In addition, the boosting section 22-1 boosts the potential V2 (3.3 V) and the boosted potential is supplied to the row decoder 23. In contrast, when the output potential V1 of the charge pump circuit 22 becomes higher than the detection level VL, the output signal V3 of the potential detecting circuit 21 becomes "L" level, with the result that the oscillating operation of the oscillating section 22-1 is ceased.

The operations as described above are repeated, so that the output potential of the charge pump circuit 22 is kept constant.

Figure 14:
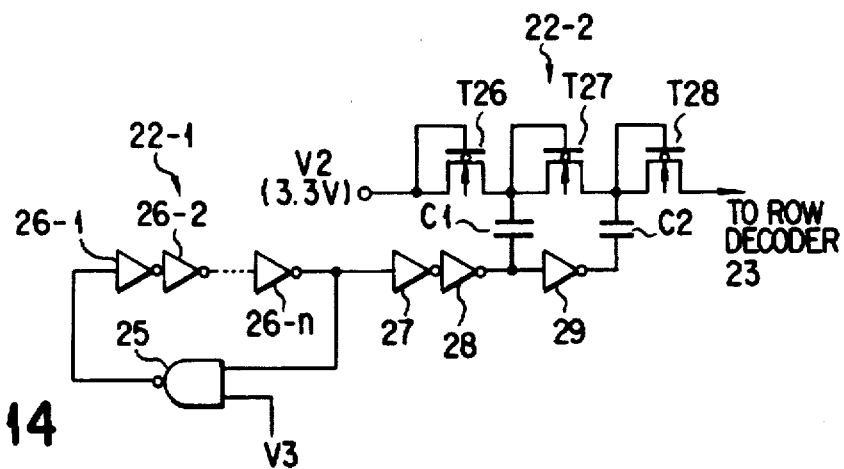
FIG. 14 is a circuit diagram showing another structure of the charge pump circuit shown in FIG. 12.

FIG. 14 shows another structure of the charge pump circuit shown in FIG. 12. In the circuit shown in FIG. 14, the MOSFETs T23 to T25 of the circuit shown in FIG. 13 are replaced by intrinsic type MOSFETs T26 to T28. Since the threshold voltage of the MOSFETs T26 to T28 is about 0 V, the output voltage is not reduced by the threshold voltage of the MOSFETs. Therefore, the operation efficiency of the boosting section 22-2 can be increased as compared to that in the circuit shown in FIG. 13.

FIG. 15 shows another structure of the boosting section 22-2 of the charge pump circuit 22 shown in FIG. 13. The boosting section 22-2 is operated by an output of an oscillating section (not shown) which generates clock signals $\phi 1$ to $\phi 4$ of four phases as shown in FIG. 16.

Current paths of N-channel enhancement type MOSFETs T29 to T31 are connected in series. The supply potential V2 (3.3 V) is applied to the drain of the MOSFET T29. The row decoder 23 is connected to the source of the MOSFET T31. A current path of an N-channel enhancement type MOSFET T32 is connected across the drain and the gate of the MOSFET T29, and the gate of the MOSFET T32 is connected to the source of the MOSFET T29. A current path of an N-channel enhancement type MOSFET T33 is connected across the drain and the gate of the N-channel enhancement type MOSFET T30, and the gate of the MOSFET T33 is connected to the source of the MOSFET T30. Similarly, a current path of an N-channel enhancement type MOSFET T34 is connected across the drain and the gate of the MOSFET T31, and the gate of the MOSFET T34 is connected to the source of the MOSFET T31. The clock signal $\phi 1$ is supplied to one electrode of a capacitor C3, and the other electrode thereof is connected to a connection node between current paths of the MOSFETs T29 and T30. The clock signal $\phi 2$ is supplied to one electrode of a capacitor C4, and the other electrode thereof is connected to a connection node between current paths of the MOSFETs T30 and T31. The clock signal $\phi 4$ is supplied to one electrode of a capacitor C5, and the other electrode thereof is connected to the gate of the MOSFET T29. The clock signal $\phi 3$ is supplied to one electrode of the capacitor C6 and the other electrode thereof is connected to the gate of the MOSFET T30. The clock signal $\phi 4$ is also supplied to one electrode of a capacitor C7 and the other electrode thereof is connected to the gate of the MOSFET T31.

Even with the boosting section 22-2 driven by the clock signals $\phi 1$ to $\phi 4$ of the four phases as shown in FIG. 15, an output potential can be kept constant in the same manner as in the circuit driven by clock signals of two phases, as shown in FIGS. 13 and 14, by controlling the oscillating operation of the oscillating section by means of the potential detecting circuit.

FIG. 17 shows still another structure of the charge pump circuit shown in FIG. 12. In the circuit shown in FIG. 17, the N-channel enhancement type MOSFETs T29 to T34 of the circuit shown in FIG. 16 are replaced by intrinsic type MOSFETs T36 to T40. With this structure, the operation efficiency of the boosting section can be increased for the same reason as in the circuit shown in FIG. 14.

Although, in the above description with reference to FIGS. 13, 14, 15 and 17, the operation of the charge pump circuit is controlled so as to make the output potential constant. However, the charge pump circuit can be constructed so as to change the frequency of a clock signal output from the oscillating section 22-1 for controlling the charge pump circuit. In this case, the operation of the charge pump circuit is controlled by decreasing the oscillation frequency, when the output potential is increased, and increasing the oscillation frequency, when the output potential is decreased. In the above description, the output of the charge pump circuit 22 is supplied to the row decoder 23. However, the present invention can be applied to a case in which the output of the charge pump circuit is supplied to the drain of a column selecting transistor of a non-volatile semiconductor memory cell or to the source of a memory cell transistor.

Figure 18:
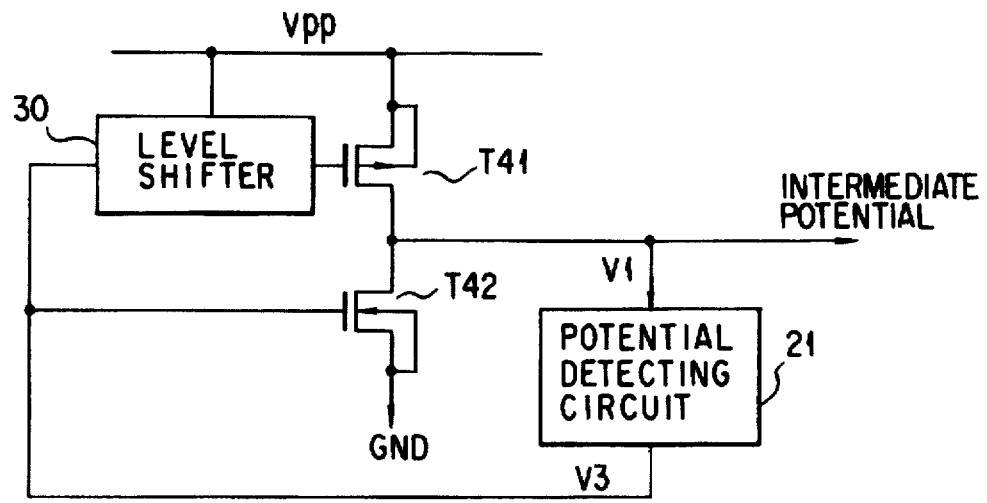
FIG. 18 is a circuit diagram showing an intermediate potential generating circuit and peripheral portions thereof, for explaining a case in which the potential detecting circuit of the present invention is applied to another circuit.

FIG. 18 is a circuit diagram showing an intermediate potential generating circuit and peripheral portions thereof, for explaining a case in which the potential detecting circuit of the present invention is applied to another circuit. A potential detecting circuit 21 detects an intermediate potential output from an intermediate potential generating circuit comprising a level shifter 30, a P-channel type MOSFET T41 and an N-channel type MOSFET T42, thereby controlling the level shifter 30 so as to make an output potential (intermediate potential) constant. The intermediate potential generating circuit is widely used to lower a supply potential to be supplied to a word line or the like, i.e., a high voltage $V_{pp}$ (12 V) supplied from an external circuit, to 10 V within a chip, so that it can be used in programming, or to lower the supply potential to 7 V so that it can be used in a flash memory or the like.

A potential of a high voltage Vpp supplied through an external pin or a high potential generated by boosting, within a chip, a supply potential supplied from an external circuit, is applied to the source of the MOSFET T41. A current path of the MOSFET T42 is connected between the drain of the MOSFET T41 and the ground GND. An output voltage V3 from the potential detecting circuit 21 is supplied to the gate of the MOSFET T42. A level shifter 31, operated by the high voltage $V_{pp}$, inverts and level-shifts (boosts) the output potential V3 output from the potential detecting circuit 21, and supplies the inverted and level-shifted potential to the MOSFET T41. An intermediate potential is output through a connection node between the drains of the MOSFETs T41 and T42. The intermediate potential (subject potential V1) is supplied to the potential detecting circuit 21. The potential detecting circuit 21 detects the level of the subject potential V1 and controls the potential so as to be constant.

Figure 19:
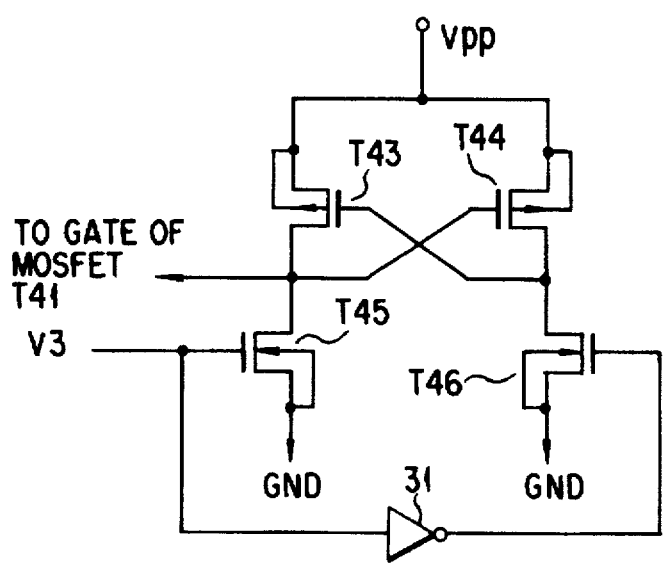
FIG. 19 is a circuit diagram showing a structure of the level shifter shown in FIG. 18.

As shown in FIG. 19, the level shifter 30 comprises P-channel enhancement type MOSFETs T43 and T44, N-channel enhancement type MOSFETs T45 and 46 and an inverter 31. An output signal V3 output from the potential detecting circuit 21 is supplied to the gate of the MOSFET T45. The signal V3 is inverted by the inverter 31 and an inverted signal is supplied to the gate of the MOSFET T46. A current path of the MOSFET T43 is connected across the high voltage power supply $V_{pp}$ and the drain of the MOSFET T45 and the source of the MOSFET T45 is connected to the ground GND. A current path of the MOSFET T44 is connected across the drain of the MOSFET T46 and the high voltage power supply $V_{pp}$ and the source of the MOSFET T46 is connected to the ground GND. The gate of the MOSFET T43 is connected to a connection node between the drains of the MOSFETs T44 and T46. The gate of the MOSFET T44 is connected to a connection node between the drains of the MOSFETs T43 and T45. The gate of the MOSFET T41 is connected to a connection node between the drains of the MOSFETs T43 and T45.

When the signal V3 is of "H" level, the MOSFETs T45 and T44 are turned on and the MOSFETs T46 and T43 are turned off. As a result, the high potential $V_{pp}$ is applied to the gate of the MOSFET T41 through the current path of the MOSFET T44. On the other hand, when the signal V3 is of "L" level, the MOSFETs T46 and T43 are turned on and the MOSFETs T45 and T44 are turned off. As a result, the ground potential GND is applied to the gate of the MOSFET T41 through the current path of the MOSFET T46. In this manner, the level of the signal V3 is inverted and shifted between the $V_{pp}$ level and the GND level.

In the structure as described above, when the intermediate potential V1 is lower than a target value, i.e., the detection level VL, the output signal V3 of the potential detecting circuit 21 becomes "L" level. As a result, the MOSFET T41 is turned on and the MOSFET T42 is turned off, so that the intermediate potential V1 is increased. On the other hand, when the intermediate potential V1 is higher than the detection level VL, the output signal V3 of the potential detecting circuit 21 becomes "H" level. As a result, the MOSFET T41 is turned off and the MOSFET T42 is turned on, so that the intermediate potential V1 is lowered.

It is preferable that the sizes of the MOSFETs, constituting the potential detecting circuit 21 and the level shifter 30, be adjusted so that both the MOSFETs T41 and T42 are turned off, when the intermediate potential V1 is equal to the reference potential $V_{ref}$.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A potential detecting circuit comprising:

an enhancement type N-channel first MOSFET having a threshold voltage Vth, said first MOSFET having a source, a drain to which a first potential supply source supplying a first potential V2 is connected, and a gate to which a subject potential V1 to be detected is applied;

load means connected to the source of said first MOSFET;

reference potential generating means for generating a reference potential; and comparing means for comparing a source potential generated by said first MOSFET with the reference potential generated by said reference potential generating means, said comparing means comprising:

a second MOSFET of a first conductivity type having a first current terminal, a second current terminal, and a gate connected to the source of said first MOSFET;

a third MOSFET of the first conductivity type having a first current terminal connected to the first current terminal of said second MOSFET, a second current terminal, and a gate supplied with the reference potential generated by said reference potential generating means;

a fourth MOSFET of a second conductivity type having a first current terminal connected to the second current terminal of said second MOSFET, a second current terminal connected to said first potential supply source, and a gate;

a fifth MOSFET of the second conductivity type having a first current terminal connected to the second current terminal of said third MOSFET, a second current terminal connected to said first potential supply source, and a gate connected to the gate of said fourth MOSFET and the second current terminal of said second MOSFET; and a sixth MOSFET of the first conductivity type having a first current terminal connected to a second potential supply source, a second current terminal connected to the first current terminals of said second and third MOSFETs, and a gate connected to the gates of said fourth and fifth MOSFETs and to a connection node between said second and fourth MOSFETs, a comparison output being obtained through a connection node between said third and fifth MOSFETs, wherein a level of the subject potential is detected on the basis of the comparison output from said comparing means;

wherein said reference potential generating means includes a seventh MOSFET and generates a reference potential independent of said first potential supply source, utilizing a threshold voltage of said seventh MOSFET; and wherein $V1-Vth \leq V2$.

2. The potential detecting circuit according to claim 1, wherein said load means includes a constant current circuit.

3. The potential detecting circuit according to claim 2, wherein said constant current circuit includes an N-channel depletion type eighth MOSFET having a drain, connected to the source of said first MOSFET, and a source and a gate connected to said second potential supply source.

4. The potential detecting circuit according to claim 2, wherein said constant current circuit includes an N-channel enhancement type eighth MOSFET having a drain and a gate, connected to the source of said first MOSFET, and a source connected to said second potential supply source.

5. The potential detecting circuit according to claim 2, wherein said constant current circuit comprises:
   an eighth MOSFET of an N-channel enhancement type having a drain connected to the source of said first MOSFET and a source connected to said second potential supply source;
   a load element connected between a gate of said eighth MOSFET and said first potential supply source;
   a ninth MOSFET of an N-channel enhancement type having a drain and a gate connected to the gate of said eighth MOSFET; and
   a tenth MOSFET of an N-channel enhancement type having a source connected to said second potential supply source and a drain and a gate connected to a source of said ninth MOSFET.

6. The potential detecting circuit according to claim 1, wherein said seventh MOSFET is of an N-channel depletion type having a first current terminal, a second current terminal, and a gate, said first current terminal connected to said first potential supply source and said reference potential generating means further comprises:
   an eighth MOSFET of an N-channel enhancement type having a first current terminal connected to the second current terminal of said seventh MOSFET, a second current terminal connected to said second potential supply source, and a gate connected to the gate of said seventh MOSFET and the second current terminal of said seventh MOSFET, the reference potential being output through a connection node between said seventh and eighth MOSFETs.

7. The potential detecting circuit according to claim 1, wherein said seventh MOSFET is of a P-channel enhancement type having a source, a drain, and a gate, the source connected to said first potential supply source and said reference potential generating means further comprises:
   an eighth MOSFET of the P-channel enhancement type having a source, a drain, and a gate, the source connected to the drain and the gate of said seventh MOSFET;
   a load element connected between the drain and the gate of said eighth MOSFET and said second potential supply source;
   a ninth MOSFET of the P-channel enhancement type having a source, a drain, and a gate, the source connected to said first potential supply source and the gate connected to the drain of said eighth MOSFET; and
   a tenth MOSFET of an N-channel enhancement type having a drain and a gate connected to the drain of said ninth MOSFET and a source connected to said second potential supply source, the reference potential being output through a connection node between the drains of said ninth and tenth MOSFETs.

8. The potential detecting circuit according to claim 1, further comprising a waveform-shaping inverter having an input terminal connected to the connection node between the current paths of said third and fifth MOSFETs.

9. The potential detecting circuit according to claim 1 wherein the subject potential is an output potential of a charge pump circuit which is controlled so as to be constant by means of the comparison output from said comparing means.

10. The potential detecting circuit according to claim 9, wherein said charge pump circuit includes an oscillating section and a boosting section for boosting an oscillating output from the oscillating section, and an operation of the oscillating section is controlled by means of the comparison output from said comparing means.

11. The potential detecting circuit according to claim 1, wherein the subject potential is an output potential of an intermediate potential generating circuit, the output potential being controlled so as to be constant by means of the comparison output from said comparing means.

12. The potential detecting circuit according to claim 11, wherein said intermediate potential generating circuit comprises:
   a level shifter for level-shifting a potential of the comparison output from said comparing means;
   an eighth MOSFET of the second conductivity type having a first current terminal and a second current terminal, the first current terminal connected to a high voltage power supply, ON and OFF operations of said eighth MOSFET being controlled by means of the comparison output from said comparing means; and
   a ninth MOSFET of the first conductivity type having a first current terminal connected to the second current terminal of said eighth MOSFET and a second current terminal connected to said second potential supply source, ON and OFF operations of said ninth MOSFET being controlled by means of the comparison output from said comparing means, and a potential at a connection node between said eighth and ninth MOSFET being supplied to the gate of said first MOSFET.

13. A semiconductor memory device comprising:
   a memory cell array;
   a row decoder for decoding a row address signal and selecting a row of said memory cell array;
   a charge pump circuit for boosting a source voltage and generating a boosted potential V1, which is supplied to said row decoder; and
   a potential detecting circuit for detecting the boosted potential supplied from said charge pump circuit to said row decoder and controlling a boosting operation of said charge pump circuit, said potential detecting circuit including:
      an enhancement type N-channel first MOSFET having a threshold voltage Vth, said first MOSFET having a source, a drain to which a first potential supply source supplying a first potential V2 is connected, and a gate to which the boosted potential V1 is applied;
      a load circuit connected to the source of said first MOSFET;
      a reference potential generating circuit for generating a reference potential; and
      a comparing circuit for comparing a source potential generated by said first MOSFET with the reference potential generated by said reference potential generating circuit, said comparing circuit comprising:
         a second MOSFET of a first conductivity type having a first current terminal, a second current terminal, and a gate connected to the source of said first MOSFET;
         a third MOSFET of the first conductivity type having a first current terminal connected to the first current terminal of said second MOSFET, a second current terminal, and a gate supplied with the reference potential generated by said reference potential generating circuit;

a fourth MOSFET of a second conductivity type having a first current terminal connected to the second current terminal of said second MOSFET, a second current terminal connected to said first potential supply source, and a gate;

a fifth MOSFET of the second conductivity type having a first current terminal connected to the second current terminal of said third MOSFET, a second current terminal connected to said first potential supply source, and a gate connected to the gate of said fourth MOSFET and to the second current terminal of said second MOSFET; and a sixth MOSFET of the first conductivity type having a first current terminal connected to a second potential supply source and a second current terminal connected to the first current terminals of said second and third MOSFETs, and a gate connected to the gates of said fourth and fifth MOSFETs and to a connection node between said second and fourth MOSFETs, a comparison output being obtained through a connection node between said third and fifth MOSFETs, wherein a level of the boosted potential output from said charge pump circuit is detected on the basis of the comparison output from the comparison output from said comparing circuit, and when the boosted potential rises, said charge pump circuit outputs a lower output potential, whereas when the boosted potential is lowered, said charge pump circuit outputs a higher output potential;

wherein said reference potential generating circuit includes a seventh MOSFET and generates a reference potential independent of said first potential supply source, utilizing a threshold voltage of said seventh MOSFET; and wherein $V1-Vth \leq V2$.

14. The semiconductor memory device according to claim 13, wherein said load circuit includes a constant current circuit.

15. The semiconductor memory device according to claim 13, wherein said charge pump circuit includes an oscillator portion constituted by a ring oscillator and a boosting portion for boosting an output of said oscillator portion, and an operation of said oscillator portion is controlled by an output potential of said potential detecting circuit.

16. The semiconductor memory device according to claim 15, wherein when an output potential from said charge pump circuit is higher than the reference potential, the operation of the oscillator portion is stopped.

17. The semiconductor memory device according to claim 13, wherein said potential detecting circuit further comprises a waveform-shaping inverter having an input terminal connected to the connection node between said third and fifth MOSFETs.

18. An intermediate potential generating circuit comprising:

a first MOSFET of a first conductivity type having a first current terminal, a second current terminal, and a gate, the first current terminal connected to a first potential supply source;

a second MOSFET of a second conductivity type having a first current terminal, a second current terminal, and a gate, the first current terminal connected to the second current terminal of said first MOSFET, and the second current terminal connected to a second potential supply source;

a level shifter, connected to the gate of said first MOSFET, for controlling ON and OFF operations of said first MOSFET: said level shifter operating on a potential provided by said first potential supply source; and a potential detecting circuit for detecting a potential V1 at a connection node between said first and second MOSFETs and for controlling the level shifter and the gate of said second MOSFET, wherein said level shifter reverses an output potential of said potential detecting circuit, shifts a level of the output potential; and then supplies the output potential to the gate of said first MOSFET;

said potential detecting circuit including:

an enhancement type N-channel third MOSFET having a threshold voltage Vth, said third MOSFET having a source, a drain to which a third potential supply source a third potential V2 is connected, and a gate to which the potential at the connection node between said first and second MOSFETs is applied;

a load circuit connected to the source of said third MOSFET;

a reference potential generating circuit for generating a reference potential; and a comparing circuit for comparing a source potential generated by said third MOSFET with the reference potential generated by said reference potential generating circuit, said comparing circuit comprising:

a fourth MOSFET of the second conductivity type having a first current terminal, a second current terminal, and a gate connected to the source of said third MOSFET;

a fifth MOSFET of the second conductivity type having a first current terminal connected to the first current terminal of said fourth MOSFET, a second current terminal, and a gate supplied with the reference potential generated by said reference potential generating circuit;

a sixth MOSFET of the first conductivity type having a first current terminal connected to the second current terminal of said fourth MOSFET, a second current terminal connected to said third potential supply source, and a gate;

a seventh MOSFET of the first conductivity type having a first current terminal connected to the second current terminal of said fifth MOSFET, a second current terminal connected to said third potential supply source, and a gate connected to the gate of said sixth MOSFET and to the second current terminal of said fourth MOSFET; and an eighth MOSFET of the second conductivity type having a first current terminal connected to said second potential supply source and a second current terminal connected to the first current terminals of said fourth and fifth MOSFETs, and a gate connected to the gates of said sixth and seventh MOSFETs and to a connection node between said fourth and sixth MOSFETs, a comparison output being obtained through a connection node between said fifth and seventh MOSFETs, wherein a level of an intermediate potential output from the connection node between said first and second MOSFETs is detected on the basis of the comparison output from said comparing circuit, and when the intermediate potential rises, a conduction resistance of said first MOSFET is increased, whereas when the intermediate potential is lowered, the conduction resistance of said first MOSFET is decreased;

wherein said reference potential generating circuit includes a ninth MOSFET and generates a reference potential independent of said third potential supply source, utilizing a threshold voltage of said ninth MOSFET; and wherein $V1-Vth \leq V2$.

19. The intermediate potential generating circuit according to claims 18, wherein said load circuit includes a constant current circuit.

20. The intermediate potential generating circuit according to claim 18, wherein said level shifter comprises:

a tenth MOSFET of the second conductivity type having a first current terminal connected to said second potential supply source, a second current terminal and a gate to which an output signal from said potential detecting circuit is supplied;

an eleventh MOSFET of the second conductivity type having a first current terminal connected to said second potential supply source, a second current terminal and a gate to which an inverted signal of an output signal from said potential detecting circuit is supplied;

a twelfth MOSFET of the first conductivity type having the first current terminal connected to the second current terminal of said tenth MOSFET, a second current terminal connected to said first potential supply source, and a gate connected to the second current terminal of said eleventh MOSFET; and a thirteenth MOSFET of the first conductivity type having a first current terminal connected to the second current terminal of said eleventh MOSFET, a second current terminal connected to said first potential supply source, and a gate connected to the second current terminal of said tenth MOSFET.

21. The intermediate potential generating circuit according to claim 18, wherein said potential detecting circuit further comprises a waveform-shaping inverter having an input terminal connected to the connection node between said fifth and seventh MOSFETs.

\* \* \* \* \*